(12) United States Patent
Chai

(10) Patent No.: US 9,733,536 B2
(45) Date of Patent: Aug. 15, 2017

(54) ARRAY SUBSTRATE MANUFACTURING METHOD, ARRAY SUBSTRATE FORMED THEREBY AND LIQUID CRYSTAL DISPLAY APPARATUS

(71) Applicant: SHENZHEN CHINA STAR OPTOELECTRONICS TECHNOLOGY CO., LTD., Shenzen, Guangdong (CN)

(72) Inventor: Li Chai, Shenzhen (CN)

(73) Assignee: SHENZHEN CHINA STAR OPTOELECTRONICS TECHNOLOGY CO., LTD., Shenzen, Guangdong (CN)

( * ) Notice: Subject to any disclaimer, the term of this patent is extended or adjusted under 35 U.S.C. 154(b) by 305 days.

(21) Appl. No.: 14/390,656

(22) PCT Filed: Jul. 11, 2014

(86) PCT No.: PCT/CN2014/082089
§ 371 (c)(1),
(2) Date: Oct. 3, 2014

(87) PCT Pub. No.: WO2016/004633
PCT Pub. Date: Jan. 14, 2016

(65) Prior Publication Data
US 2016/0252790 A1    Sep. 1, 2016

(30) Foreign Application Priority Data

Jul. 8, 2014  (CN) .......................... 2014 1 0323333

(51) Int. Cl.
*G02F 1/1333*   (2006.01)
*G02F 1/1362*   (2006.01)
(Continued)

(52) U.S. Cl.
CPC ........ *G02F 1/136286* (2013.01); *G02F 1/136* (2013.01); *G02F 1/1333* (2013.01);
(Continued)

(58) Field of Classification Search
CPC ............. G02F 1/136286; G02F 1/1333; G02F 1/133345; G02F 1/133514; G02F 1/136;
(Continued)

(56) References Cited

U.S. PATENT DOCUMENTS

| | | | | |
|---|---|---|---|---|
| 6,124,153 A | * | 9/2000 | Lee | H01L 29/42364 148/DIG. 163 |
| 2007/0090421 A1 | * | 4/2007 | Jung | G02F 1/136213 257/291 |
| 2010/0227442 A1 | * | 9/2010 | Lu | H01L 29/66765 438/158 |

FOREIGN PATENT DOCUMENTS

| | | |
|---|---|---|
| CN | 1952737 A | 4/2007 |
| JP | 2001264798 A | 9/2001 |

(Continued)

*Primary Examiner* — Nathanael R Briggs
(74) *Attorney, Agent, or Firm* — Sughrue Mion, PLLC

(57) ABSTRACT

An array substrate manufacturing method, an array substrate formed by the method, and a liquid crystal apparatus are disclosed. The method includes steps of depositing a first metal layer to form a plurality of scanning lines; depositing a first insulating layer and performing a patterning process on the first insulating layer; depositing a semiconductor layer and a second metal layer to form a plurality of data lines and thin-film transistors; depositing a second insulating layer to form a plurality of contact holes; and depositing a transparent layer to form a plurality of pixel electrodes.

8 Claims, 4 Drawing Sheets

(51) Int. Cl.
*G02F 1/136* (2006.01)
*G02F 1/1368* (2006.01)
*H01L 21/77* (2017.01)
*G02F 1/1335* (2006.01)
*H01L 21/027* (2006.01)
*H01L 21/311* (2006.01)
*H01L 27/12* (2006.01)
*H01L 29/66* (2006.01)
*H01L 29/786* (2006.01)

(52) U.S. Cl.
CPC .......... *G02F 1/1362* (2013.01); *G02F 1/1368* (2013.01); *G02F 1/133345* (2013.01); *G02F 1/133514* (2013.01); *H01L 21/0273* (2013.01); *H01L 21/0274* (2013.01); *H01L 21/31116* (2013.01); *H01L 21/31144* (2013.01); *H01L 21/77* (2013.01); *H01L 27/124* (2013.01); *H01L 27/1222* (2013.01); *H01L 27/1288* (2013.01); *H01L 29/66765* (2013.01); *H01L 29/78669* (2013.01)

(58) Field of Classification Search
CPC . G02F 1/1362; G02F 1/1368; H01L 21/0273; H01L 21/0274; H01L 21/31116; H01L 21/31144; H01L 21/77; H01L 27/1222; H01L 27/124; H01L 27/1288; H01L 29/66765; H01L 29/78669
See application file for complete search history.

(56) References Cited

FOREIGN PATENT DOCUMENTS

| | | |
|---|---|---|
| JP | 2007169076 A | 7/2007 |
| JP | 200963603 A | 3/2009 |

* cited by examiner

ARRAY SUBSTRATE MANUFACTURING METHOD, ARRAY SUBSTRATE FORMED THEREBY AND LIQUID CRYSTAL DISPLAY APPARATUS

BACKGROUND OF THE INVENTION

Field of the Invention

The present invention relates to the field of liquid crystal display technology, and more particularly to an array substrate manufacturing method, an array substrate formed by the method, and a liquid crystal apparatus having the same.

Description of the Related Art

With the development of the information society, the demand for liquid crystal display apparatuses is getting higher and higher, thereby promoting the development of the liquid crystal display panel industry. The size of the liquid crystal display panels is increasing, and the requirements for the quality of the liquid crystal display panel are increasingly higher.

At present, since scanning signals attenuate over the scanning lines, the brightness level of the display area with greater attenuation is lower than that of the display area with lesser attenuation. That is, for a large-sized liquid crystal display panel, in the same gray scale image, the brightness level of two sides of the display area is greater that that of the middle of the display area (this is because the attenuation of the scanning signal on both sides is much less).

For the above problems, there have been two improved solutions.

The first one is to reduce the impedance of the scanning lines by increasing their line width. However, increasing the line width of the scanning lines will also reduce the aperture rate of pixel units.

The second one is to chamfer the waveform of the scanning signals. However, this will lower the overall brightness level of the liquid crystal display apparatus, which needs to be further enhanced by increasing the power of a backlight module that will raise the power consumption of the liquid crystal display apparatus.

Therefore, it is necessary to provide an array substrate manufacturing method and an array substrate formed thereby to overcome the problems existing in the conventional technology.

SUMMARY OF THE INVENTION

An object of the present invention is to provide an array substrate manufacturing method, an array substrate formed by the method, and a liquid crystal apparatus having the same so as to solve a technical problem where the image displayed by conventional liquid crystal devices has an uneven brightness level or the conventional liquid crystal devices have a lower aperture rate.

In order to achieve the foregoing object, the technical solutions of the present invention are as follows:

An array substrate manufacturing method is used to be disposed in a corresponding liquid crystal display panel and comprises steps of:

depositing a first metal layer on a substrate and forming a plurality of scanning lines by performing a patterning process on the first metal layer;

depositing a first insulating layer and performing a patterning process on the first insulating layer so that the patterned first insulating layer has a thickness at two sides thereof relatively greater than that at a middle thereof;

depositing a semiconductor layer and a second metal layer and forming a plurality of data lines and a plurality of thin-film transistors by performing a patterning process on the semiconductor layer and the second metal layer;

depositing a second insulating layer and performing a patterning process on the second insulating layer to form a plurality of contact holes; and depositing a transparent layer and performing a patterning process on the transparent layer to form a plurality of pixel electrodes so that each one of the pixel electrodes is connected to a corresponding thin-film transistor via a corresponding one of the contact holes.

In the foregoing array substrate manufacturing method of the present invention, the patterned first insulating layer has a substantially quadrilateral outline in cross section; and the quadrilateral outline has a curved side which is concave-shaped.

In the foregoing array substrate manufacturing method of the present invention, the step of performing the patterning process on the first insulating layer further includes steps of:

coating a photoresist layer on the first insulating layer;

using a grayscale mask to expose the photoresist layer;

developing the exposed photoresist layer so that the photoresist layer has a curved surface; and performing an etching process on the first insulating layer coated with the photoresist layer having the curved surface so as to form the patterned first insulating layer.

In the foregoing array substrate manufacturing method of the present invention, the step of performing an etching process on the first insulating layer coated with the photoresist layer having the curved surface further includes steps of:

performing an ashing process on the photoresist layer which has the curved surface; and performing dry etching on the first insulating layer on the first insulating layer so as to form the patterned first insulating layer.

In the foregoing array substrate manufacturing method of the present invention, a shading degree of a middle portion of the grayscale mask is less than that of two side portions of the grayscale mask.

In the foregoing array substrate manufacturing method of the present invention, the step of depositing the semiconductor layer and the second metal layer further includes steps of:

forming an ohmic contact layer on the semiconductor layer; and depositing the second metal layer on the ohmic contact layer.

In the foregoing array substrate manufacturing method of the present invention, each one of the thin-film transistors includes a source electrode, a drain electrode and a gate electrode; a channel is formed between the source electrode and the drain electrode; the source electrode is connected to a corresponding data line; the gate electrode is connected to a corresponding scan line; and the drain electrode is connected to a corresponding pixel electrode.

In the foregoing array substrate manufacturing method of the present invention, the source electrode is connected to the channel through an ohmic contact layer.

In the foregoing array substrate manufacturing method of the present invention, the drain electrode is connected to channel through an ohmic contact layer.

An array substrate being disposed in a corresponding liquid crystal display panel comprises:

a plurality of scanning lines for transmitting scanning signals;

a plurality of data lines for transmitting data signals;

a plurality of thin-film transistors for transmitting the data signals to a plurality of pixel electrodes, respectively, according to the scanning signals so as to display images represented by the data signals;

a first insulating layer disposed between the thin-film transistors and the scanning lines; and a second insulating layer disposed between the pixel electrodes and the thin-film transistors; wherein the first insulating layer has a thickness at two sides thereof relatively greater than that at a middle thereof.

In the foregoing array substrate of the present invention, the first insulating layer has a substantially quadrilateral outline in cross section; and the quadrilateral outline has a curved side which is concave-shaped.

In the foregoing array substrate of the present invention, each one of the thin-film transistors includes a source electrode, a drain electrode and a gate electrode; a channel is formed between the source electrode and the drain electrode; the source electrode is connected to a corresponding data line; the gate electrode is connected to a corresponding scan line; and the drain electrode is connected to a corresponding pixel electrode.

In the foregoing array substrate of the present invention, the source electrode is connected to the channel through an ohmic contact layer.

In the foregoing array substrate of the present invention, the drain electrode is connected to the channel through an ohmic contact layer.

A liquid crystal display apparatus is further provided to have a liquid crystal panel having a color filter substrate and an array substrate, wherein the array substrate has:

a plurality of scanning lines for transmitting scanning signals;

a plurality of data lines for transmitting data signals;

a plurality of thin-film transistors for transmitting the data signals to a plurality of pixel electrodes, respectively, according to the scanning signals so as to display images represented by the data signals;

a first insulating layer disposed between the thin-film transistors and the scanning lines; and a second insulating layer disposed between the pixel electrodes and the thin-film transistors; wherein the first insulating layer has a thickness at two sides thereof relatively greater than that at a middle thereof.

In the foregoing liquid crystal display apparatus of the present invention, the first insulating layer has a substantially quadrilateral outline in cross section; and the quadrilateral outline has a curved side which is concave-shaped.

In the foregoing liquid crystal display apparatus of the present invention, each one of the thin-film transistors includes a source electrode, a drain electrode and a gate electrode; a channel is formed between the source electrode and the drain electrode; the source electrode is connected to a corresponding data line; the gate electrode is connected to a corresponding scan line; and the drain electrode is connected to a corresponding pixel electrode.

In the foregoing liquid crystal display apparatus of the present invention, the source electrode is connected to the channel through an ohmic contact layer.

In the foregoing liquid crystal display apparatus of the present invention, the drain electrode is connected to the channel through an ohmic contact layer.

Compared with the conventional liquid crystal display apparatus, the present invention uses a first insulating layer with different thicknesses so that the liquid crystal display apparatus can display images with an even brightness level, thereby solving the technical problem where the image displayed by conventional liquid crystal devices has an uneven brightness level or the conventional liquid crystal devices have a lower aperture rate.

DETAILED DESCRIPTION OF THE PREFERRED EMBODIMENTS

The following description of each embodiment is referring to the accompanying drawings so as to illustrate practicable specific embodiments in accordance with the present invention. The directional terms described in the present invention, such as upper, lower, front, rear, left, right, inner, outer, side, etc., are only directions referring to the accompanying drawings, so that the used directional terms are used to describe and understand the present invention, but the present invention is not limited thereto.

Figure 1:
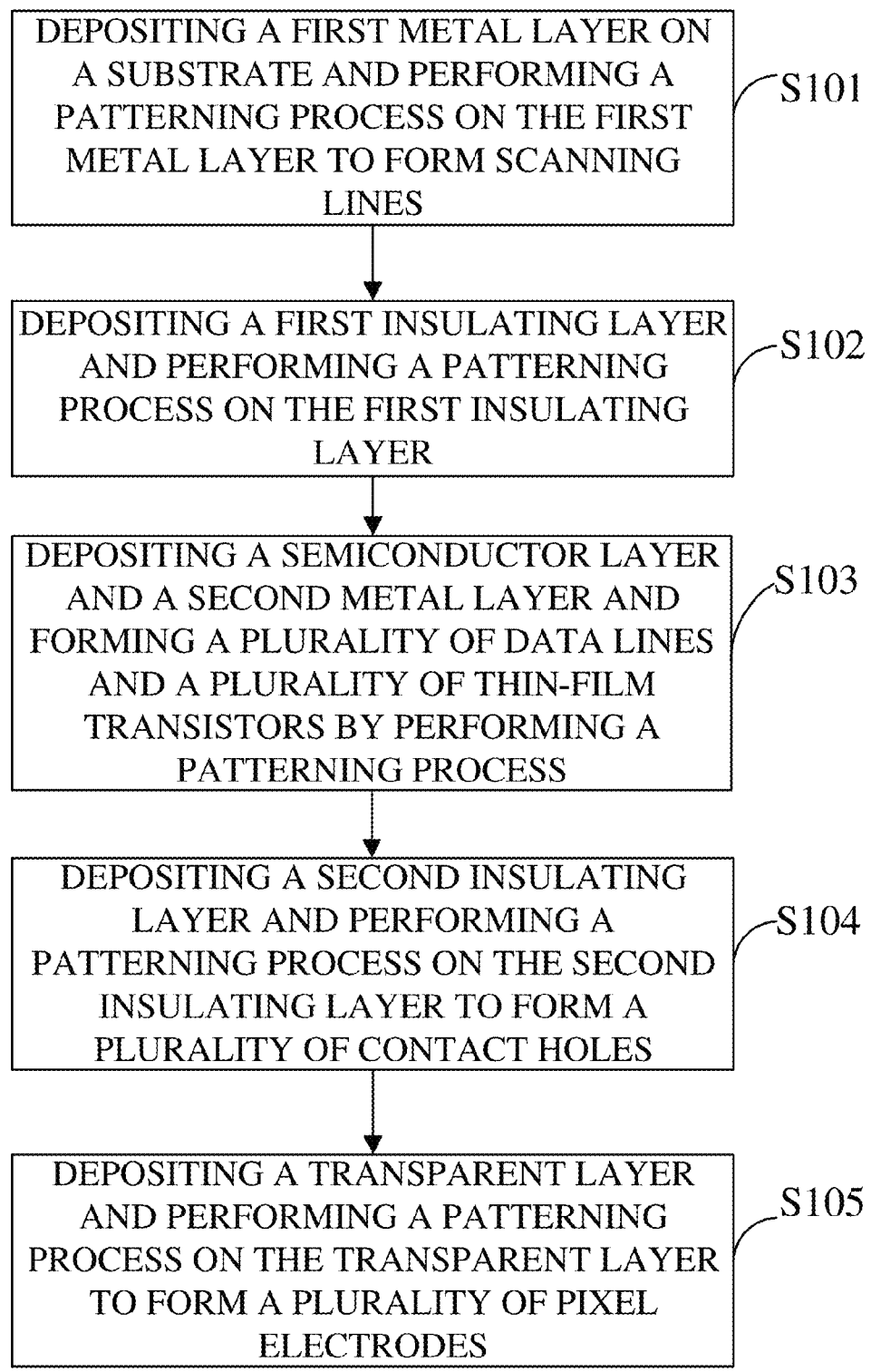
FIG. 1 is a flow chart of an array substrate manufacturing method according to a preferred embodiment of the present invention.

A preferred embodiment of the present invention provides an array substrate manufacturing method. FIG. 1 is a flow chart of an array substrate manufacturing method according to a preferred embodiment of the present invention. The array substrate manufacturing method of the preferred embodiment comprises steps of:

Step S101: depositing a first metal layer on a substrate and performing a patterning process on the first metal layer to form a plurality of scanning lines;

Step S102: depositing a first insulating layer and performing a patterning process on the first insulating layer;

Step S103: depositing a semiconductor layer and a second metal layer and performing a patterning process on the semiconductor layer and the second metal layer to form a plurality of data lines and a plurality of thin-film transistors;

Step S104: depositing a second insulating layer and performing a patterning process on the second insulating layer to form a plurality of contact holes; and Step S105: depositing a transparent layer and performing a patterning process on the transparent layer to form a plurality of pixel electrodes.

The array substrate manufacturing method of the preferred embodiment completes after step S105.

The following sections will describe the specific process of each step of the array substrate manufacturing method of the preferred embodiment in detail.

In step S101, the substrate is first provided, and then the first metal layer is deposited on the substrate, wherein the material of the first metal layer may be nobelium, molybdenum, aluminum, copper, titanium, tantalum or tungsten; and then a patterning process is performed on the first metal layer with a mask so as to form a plurality scanning lines on the substrate.

Figure 2:
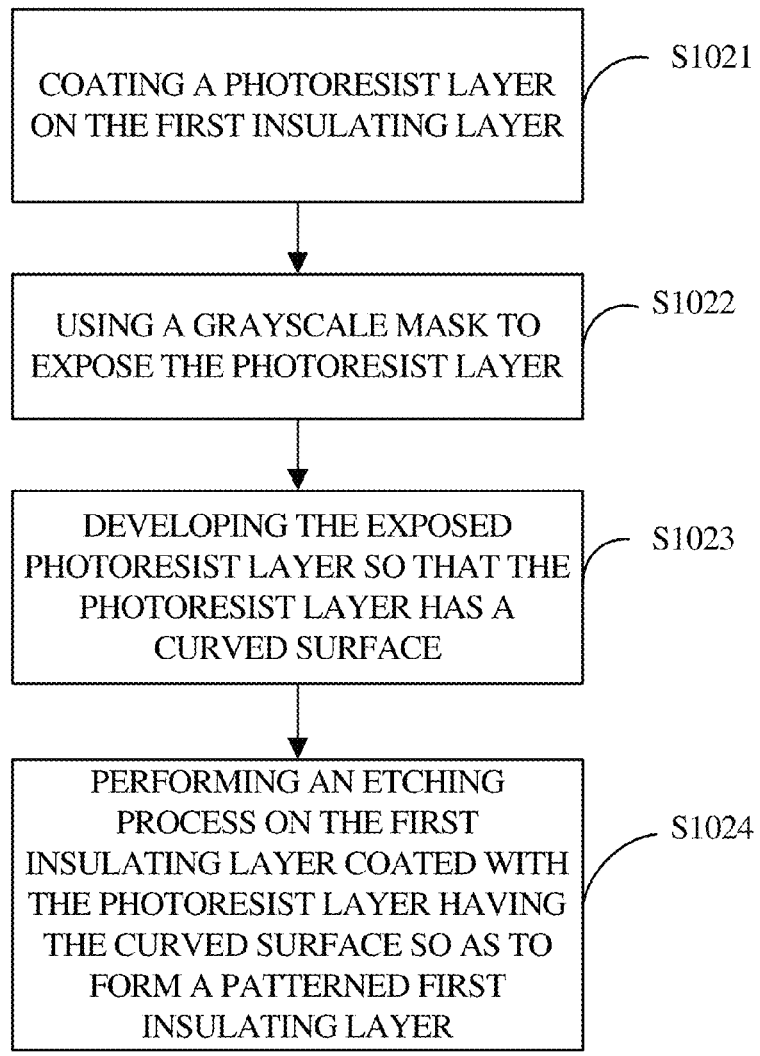
FIG. 2 is a specific flowchart of the step S102 of the array substrate manufacturing method according to the preferred embodiment of the present invention.
Figure 3:
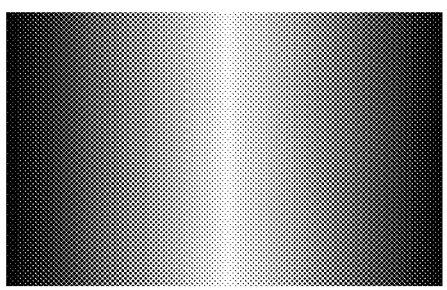
FIG. 3 is a structural schematic diagram of a grayscale mask used in the array substrate manufacturing method according to the preferred embodiment of the present invention.
Figure 4:
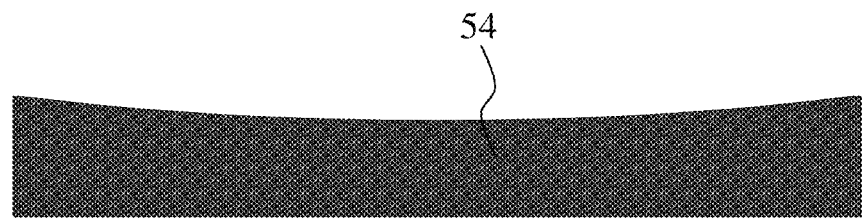
FIG. 4 is a cross-sectional view of a first insulating layer disposed on the array substrate of a liquid crystal display apparatus according to the preferred embodiment of the present invention.

In step S102, the first insulating layer is deposited on the first metal layer and may be a silicon nitride layer; and then a patterning process is performed on the first insulating layer by using a grayscale mask. FIG. 2 is a specific flowchart of step S102 of the array substrate manufacturing method according to the preferred embodiment of the present invention. With reference to FIG. 2, step S102 may further include steps of:

Step S1021: performing a photoresist coating process to evenly coat a photoresist layer on a surface of the first insulating layer;

Step S1022: using a grayscale mask to expose the photoresist layer, where a shading degree of a middle portion of the grayscale mask is less than that of two side portions of the grayscale mask, wherein as shown in FIG. 3, which is a structural schematic diagram of the grayscale mask used in the array substrate manufacturing method according to the preferred embodiment of the present invention, the area at the two sides of the grayscale mask has the highest shading degree, the area at the middle of the grayscale mask has the lowest shading degree, and the shading degree at the rest of the area of the grayscale mask changes gradually; wherein in FIG. 3, the middle portion of the grayscale mask has a shading degree of 0%; and the side portions of the grayscale mask have a shading degree of 50% to 100%, and the actual shading degree at the side portions can be determined according to user requirements;

Step S1023: developing the exposed photoresist layer, wherein since photoresists at different positions receive different degrees of light exposure, after the development, a photoresist layer having a curved surface is formed, wherein the more light exposure the photoresist receives, the more portions of the photoresist dissolve in the developer so that the photoresist layer with a curved surface having a middle concave is formed; and Step S1024: performing a dry etching process on the first insulating layer which is coated with the photoresist layer which has the curved surface, wherein an oxidizing gas for the dry etching process may perform full ashing on the entire photoresist layer and continue the dry etching process on the first insulating layer. Since different portions of the photoresist layer require different lengths of time to receive full ashing, the first insulating layer after the dry etching process (or the patterned first insulating layer) has a substantially quadrilateral outline having a curved side in cross section where the curved side is concave shaped. FIG. 4 is a cross-sectional view of the first insulating layer disposed on the array substrate of the liquid crystal display apparatus. As shown in FIG. 4, the patterned first insulating layer has a thickness at two sides of the first insulating layer relatively greater than that at a middle of the first insulating layer.

In the step S103, the semiconductor layer, an ohmic contact layer and the second metal layer are deposited on the substrate in order. The semiconductor layer is an amorphous silicon layer. The ohmic contact layer is an amorphous silicon layer doped with phosphorus ions. The material of the second metal layer may be nobelium, molybdenum, aluminum, copper, titanium, tantalum, or tungsten. Then another mask is used to perform another patterning process on the semiconductor layer and the second metal layer so as to form a plurality of data lines and a plurality of thin-film transistors.

In step S104, the second insulating layer is deposited on the substrate and then another mask is used to perform another patterning process on the second insulating layer so as to form a plurality of contact holes through the second insulating layer.

In step S105, the transparent layer is then deposited on the substrate and another mask is used to perform another patterning process on the transparent layer so as to form a plurality of pixel electrodes. Each one of the pixel electrodes is connected to a drain electrode of a corresponding thin-film transistor via a corresponding one of the contact holes.

When the array substrate of the preferred embodiment is working, the thickness of the first insulating layer of the array substrate is inversely proportional to an efficiency of forming the channel of a corresponding thin-film transistor. That is, the thicker the first insulating layer of the array substrate is, the lower the efficiency of forming the channel of the corresponding thin-film transistor is, and thus the lower the brightness level of the display area of the liquid crystal display panel to which the thin-film transistor corresponds is when being driven by the same data signal. In the meantime, the thinner the first insulating layer of the array substrate is, the higher the efficiency of forming the channel of the corresponding thin-film transistor is, and thus the higher the brightness level of the display area of the liquid crystal display panel to which the thin-film transistor corresponds is when being driven by the same data signal.

Since the thickness of the side portion of the first insulating layer is relatively greater than that of the middle portion of the first insulating layer, the brightness level of the display area at the sides of the liquid crystal display panel should be lower than that of the display area at the middle of the liquid crystal display panel, thereby effectively compensating the attenuation of scanning signals. Thus, the liquid crystal display apparatus can provide a compensated display image having an even brightness level.

The array substrate manufacturing method uses a first insulating layer with different thicknesses so that the liquid crystal display apparatus can display images with an even brightness level, thereby solving the technical problem where the image displayed by conventional liquid crystal devices has an uneven brightness level or the conventional liquid crystal devices have a lower aperture rate.

Figure 5:
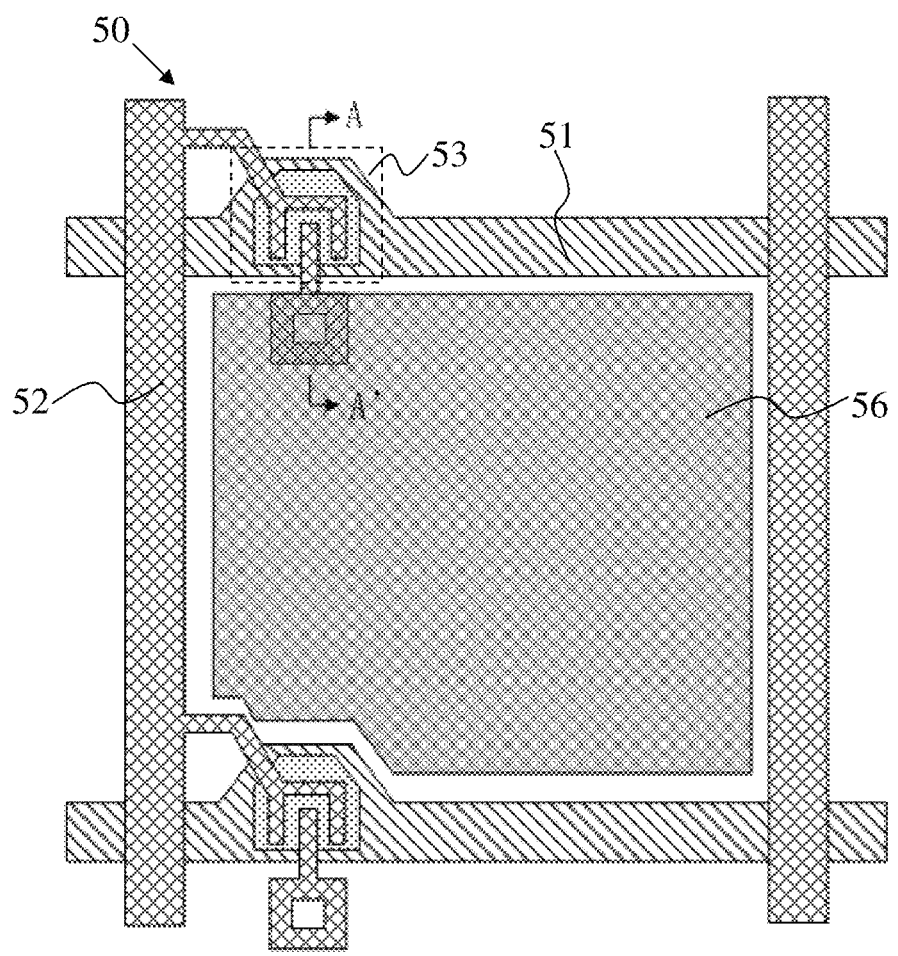
FIG. 5 is a structural schematic diagram of a pixel unit on the array substrate of the liquid crystal display apparatus according to the preferred embodiment of the present invention.
Figure 6:
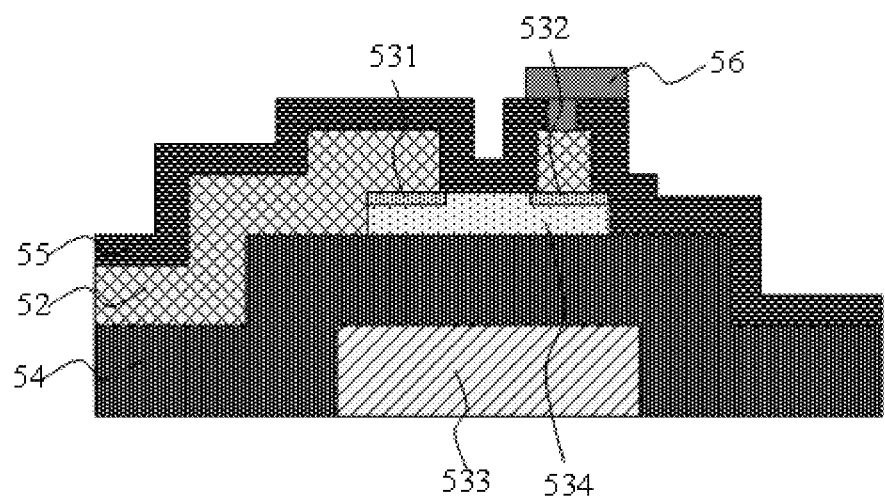
FIG. 6 is a cross-sectional view taken along line A-A' of FIG. 5.

An embodiment of the present invention further provides a liquid crystal display apparatus as shown in FIGS. 5 and 6. FIG. 5 is a structural schematic diagram of a pixel unit on the array substrate of the liquid crystal display apparatus; and FIG. 6 is a cross-sectional view taken along line A-A' of FIG. 5.

The liquid crystal display apparatus comprises a liquid crystal display panel having a color filter substrate (not shown in the figures) and an array substrate. The array substrate 50 has a plurality of scanning lines 51, a plurality of data lines 52, a plurality of thin-film transistors 53, a first insulating layer 54, and a second insulating layer 55. The scanning lines 51 are used for transmitting scanning signals. The data lines 52 are used for transmitting data signals. The thin-film transistors 53 are used for transmitting the data signals to a plurality of pixel electrodes 56, respectively, according to the scanning signals so as to display images represented by the data signals. The first insulating layer 54 is disposed between the thin-film transistors 53 and the scanning lines 51. The second insulating layer 55 is disposed between the pixel electrodes 56 and the thin-film transistors 53.

In the preferred embodiment of the array substrate 50, the thickness of the side portions of the first insulating layer 54 is relatively greater than that of the middle portion of the first insulating layer 54. The first insulating layer 54 of the whole array substrate has a substantially quadrilateral outline in cross section; and the quadrilateral outline has a curved side which is concave-shaped.

The thin-film transistor 52 includes a source electrode 531, a drain electrode 532, and a gate electrode 533, wherein a channel 534 is formed between the source electrode 531 and the drain electrode 532; the source electrode 531 is connected to a corresponding data line 52; the gate electrode 533 is connected to a corresponding scan line 51; and the drain electrode 532 is connected to a corresponding pixel electrode 56.

When the liquid crystal display apparatus of the preferred embodiment is working, the thickness of the first insulating layer 54 of the array substrate 50 is inversely proportional to an efficiency of forming the channel of a corresponding thin-film transistor 53. That is, the thicker the first insulating layer 54 of the array substrate 50 is, the lower the efficiency of forming the channel of the corresponding thin-film transistor 53 is, and thus the lower the brightness level of the display area of the liquid crystal display panel to which the thin-film transistor 53 corresponds is under the same data signal. In the meantime, the thinner the first insulating layer 54 of the array substrate 50 is, the higher the efficiency of forming the channel of the corresponding thin-film transistor 53 is, and thus the higher the brightness level of the display area of the liquid crystal display panel to which the thin-film transistor 53 corresponds is when being driven by the same data signal.

Since the thickness of the first insulating layer 54 to which the side portions of the array substrate 50 correspond is relatively greater than that to which the middle portion of the array substrate 50 correspond, the brightness level of the display area at the sides of the liquid crystal display panel should be lower than that of the display area at the middle of the liquid crystal display panel, thereby effectively compensating the attenuation of scanning signals. Thus, the liquid crystal display apparatus can provide a compensated display image having an even brightness level.

The present invention uses a first insulating layer with different thicknesses so that the liquid crystal display apparatus can display images with an even brightness level, thereby solving the technical problem where the image displayed by conventional liquid crystal devices has an uneven brightness level or the conventional liquid crystal devices have a lower aperture rate.

The present invention has been described with preferred embodiments thereof, and it is understood that many changes and modifications to the described embodiment can be carried out without departing from the scope and the spirit of the invention that is intended to be limited only by the appended claims.

What is claimed is:

1. An array substrate being mounted in a corresponding liquid crystal display panel, comprising:
   a plurality of scanning lines for transmitting scanning signals;
   a plurality of data lines for transmitting data signals;
   a plurality of thin-film transistors for transmitting the data signals to a plurality of pixel electrodes, respectively, according to the scanning signals so as to display images represented by the data signals;
   a first insulating layer disposed between the thin-film transistors and the scanning lines; and
   a second insulating layer disposed between the pixel electrodes and the thin-film transistors; wherein
   the first insulating layer has a thickness at two sides thereof relatively greater than that at a middle thereof, wherein the first insulating layer has a substantially quadrilateral outline in cross section; and the quadrilateral outline has a curved side which is concave-shaped.

2. The array substrate as claimed in claim 1, wherein each one of the thin-film transistors includes a source electrode, a drain electrode and a gate electrode; a channel is formed between the source electrode and the drain electrode; the source electrode is connected to a corresponding data line; the gate electrode is connected to a corresponding scan line; and the drain electrode is connected to a corresponding pixel electrode.

3. The array substrate as claimed in claim 2, wherein the source electrode is connected to the channel through an ohmic contact layer.

4. The array substrate as claimed in claim 2, wherein the drain electrode is connected to the channel through an ohmic contact layer.

5. A liquid crystal display apparatus comprising a liquid crystal panel having a color filter substrate and an array substrate, wherein the array substrate has:
   a plurality of scanning lines for transmitting scanning signals;
   a plurality of data lines for transmitting data signals;
   a plurality of thin-film transistors for transmitting the data signals to a plurality of pixel electrodes, respectively, according to the scanning signals so as to display images represented by the data signals;
   a first insulating layer disposed between the thin-film transistors and the scanning lines; and
   a second insulating layer disposed between the pixel electrodes and the thin-film transistors; wherein
   the first insulating layer has a thickness at two sides thereof relatively greater than that at a middle thereof, wherein the first insulating layer has a substantially quadrilateral outline in cross section; and the quadrilateral outline has a curved side which is concave-shaped.

6. The liquid crystal display apparatus as claimed in claim 5, wherein each one of the thin-film transistors includes a source electrode, a drain electrode and a gate electrode; a channel is formed between the source electrode and the drain electrode; the source electrode is connected to a corresponding data line; the gate electrode is connected to a corresponding scan line; and the drain electrode is connected to a corresponding pixel electrode.

7. The liquid crystal display apparatus as claimed in claim 6, wherein the source electrode is connected to the channel through an ohmic contact layer.

8. The liquid crystal display apparatus as claimed in claim 6, wherein the drain electrode is connected to the channel through an ohmic contact layer.

* * * * *